United States Patent
Lee et al.

(10) Patent No.: US 8,202,746 B2
(45) Date of Patent: Jun. 19, 2012

(54) METHOD OF MANUFACTURING LED PACKAGE FOR FORMATION OF MOLDING MEMBER

(75) Inventors: Seon Goo Lee, Gyeonggi-do (KR); Geun Chang Ryo, Gyeonggi-do (KR); Dong Yeoul Lee, Gyeonggi-do (KR); Yong Tae Kim, Gyeonggi-do (KR); Young Jae Song, Gyeonggi-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 84 days.

(21) Appl. No.: 12/204,049

(22) Filed: Sep. 4, 2008

(65) Prior Publication Data

US 2009/0087931 A1    Apr. 2, 2009

(30) Foreign Application Priority Data

Sep. 27, 2007    (KR) .................. 10-2007-0097217

(51) Int. Cl.
 *H01L 21/00* (2006.01)
(52) U.S. Cl. ............... 438/28; 438/26; 257/E31.117
(58) Field of Classification Search .......... 438/26, 438/28; 257/E31.117
See application file for complete search history.

(56) References Cited

U.S. PATENT DOCUMENTS

| | | | |
|---|---|---|---|
| 5,430,331 A * | 7/1995 | Hamzehdoost et al. | 257/796 |
| 5,741,446 A * | 4/1998 | Tahara et al. | 264/1.9 |
| 5,981,312 A | 11/1999 | Farquhar et al. | |
| 6,165,407 A * | 12/2000 | Tahara et al. | 264/328.1 |
| 6,586,874 B1 | 7/2003 | Komoto et al. | |
| 6,608,334 B1 | 8/2003 | Ishinaga | |
| 6,617,786 B1 | 9/2003 | Centofante | |
| 6,767,765 B2 * | 7/2004 | Chiu | 438/122 |
| 6,881,980 B1 * | 4/2005 | Ting | 257/81 |
| 6,915,570 B1 | 7/2005 | Ohgoshi et al. | |
| 2003/0168720 A1 * | 9/2003 | Kamada | 257/666 |
| 2005/0072981 A1 * | 4/2005 | Suenaga | 257/88 |
| 2006/0273338 A1 * | 12/2006 | Lee et al. | 257/99 |
| 2009/0230487 A1 * | 9/2009 | Saitoh et al. | 257/419 |

FOREIGN PATENT DOCUMENTS

| | | |
|---|---|---|
| DE | 198 33 039 A1 | 1/2000 |
| EP | 0 632 511 A2 | 1/1995 |
| EP | 1 156 535 A1 | 11/2001 |

(Continued)

OTHER PUBLICATIONS

European Search Report issued in European Patent Application No. EP 08015373.7-2222, dated Dec. 30, 2008.

(Continued)

*Primary Examiner* — David Vu
*Assistant Examiner* — Duy Nguyen
(74) *Attorney, Agent, or Firm* — McDermott Will & Emery LLP

(57) ABSTRACT

Provided is a method of manufacturing an LED package, the method including preparing a mold die which includes an upper surface and a lower surface having an outer circumferential surface and a concave surface surrounded by the outer circumferential surface, the mold die having an outlet extending from the upper surface to the lower surface; preparing a base having a light emitting section formed therein; forming an inlet formed in a predetermined region of the base excluding the region where the light emitting section is formed; positioning the mold die on the light emitting section; forming a mold member by injecting a molding compound into the inlet of the base; and removing the mold die.

5 Claims, 4 Drawing Sheets

FOREIGN PATENT DOCUMENTS

| | | |
|---|---|---|
| JP | 54-029566 | 3/1979 |
| JP | 61-237485 A | 10/1986 |
| JP | 02-058089 A | 2/1990 |
| JP | 3-79431 U | 8/1991 |
| JP | 4-65464 U | 6/1992 |
| JP | 04-306865 A | 10/1992 |
| JP | 05-055636 A | 3/1993 |
| JP | 07-001496 A | 1/1995 |
| JP | 08-088292 A | 4/1996 |
| JP | 09-162210 A | 6/1997 |
| JP | 10-135257 A | 5/1998 |
| JP | 10-138294 A | 5/1998 |
| JP | 10-319877 A | 12/1998 |
| JP | 11-026484 A | 1/1999 |
| JP | 11-026647 A | 1/1999 |
| JP | 11-087740 A | 3/1999 |
| JP | 2000-000831 A | 1/2000 |
| JP | 2001-168400 A | 6/2001 |
| JP | 2003-174123 A | 6/2003 |
| JP | 2004-006947 A | 1/2004 |
| JP | 2004-128241 A | 4/2004 |
| JP | 2004-241644 A | 8/2004 |
| JP | 2004-319900 A | 11/2004 |
| JP | 2007-027433 A | 2/2007 |
| KR | 10-2006-0135498 | 12/2006 |
| KR | 10-2007-0008269 | 1/2007 |
| WO | WO 00/71324 A1 | 11/2000 |
| WO | WO 2007/007959 A1 | 1/2007 |
| WO | WO 2007007959 A1 * | 1/2007 |

OTHER PUBLICATIONS

European Search Report issued in European Patent Application No. 08 015 373.7-2222, mailed Nov. 15, 2010.

* cited by examiner

[FIG. 1]
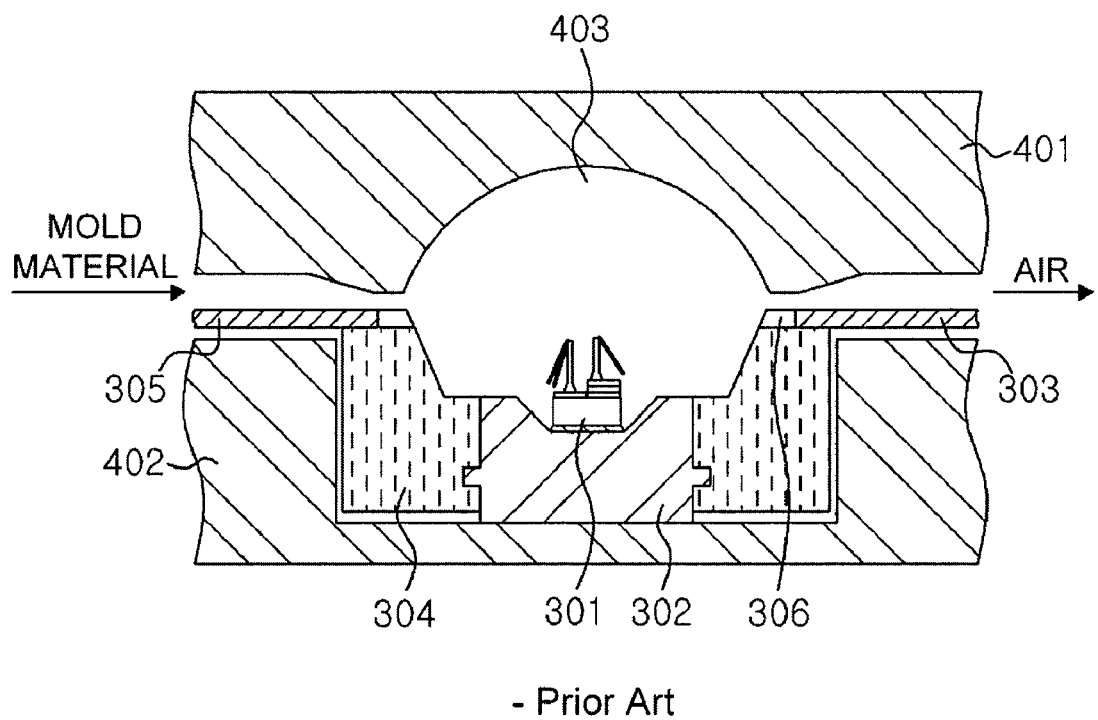
- Prior Art
[FIG. 2]
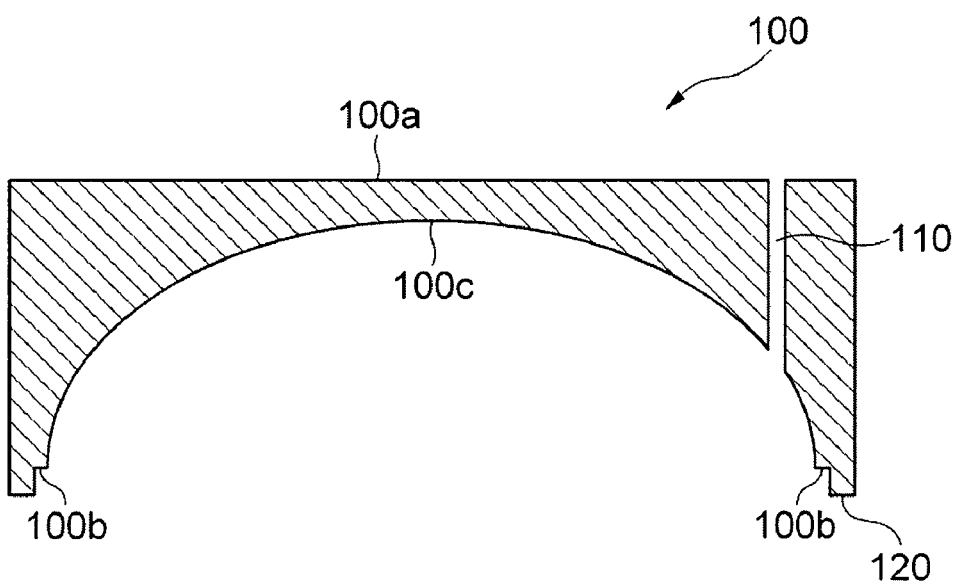

[FIG. 3]
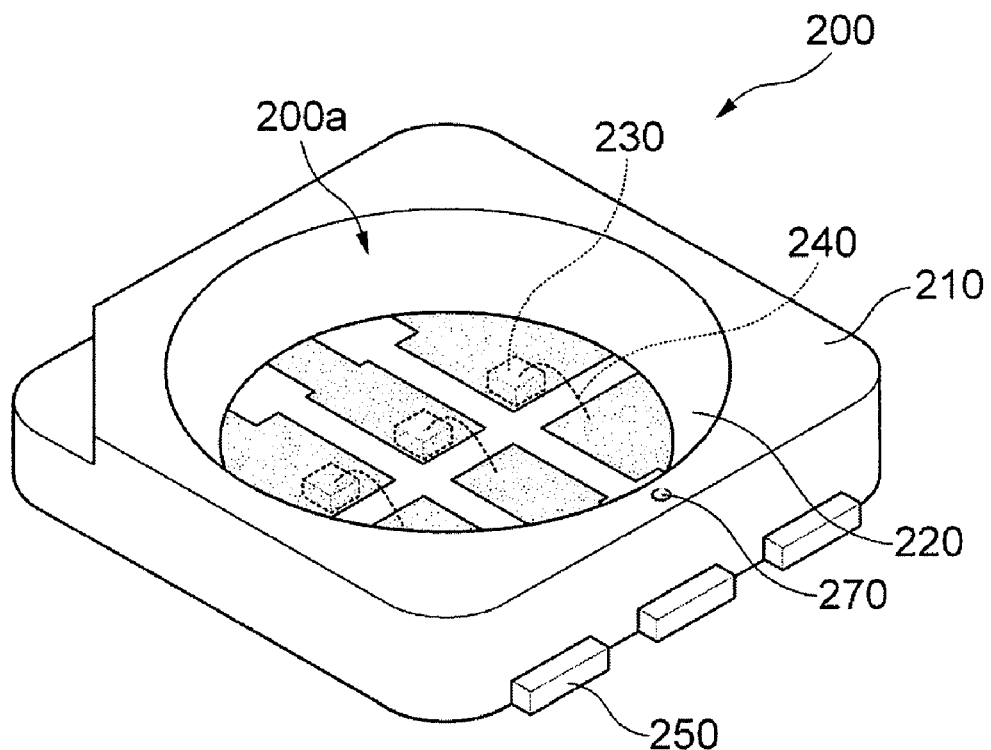
[FIG. 4]
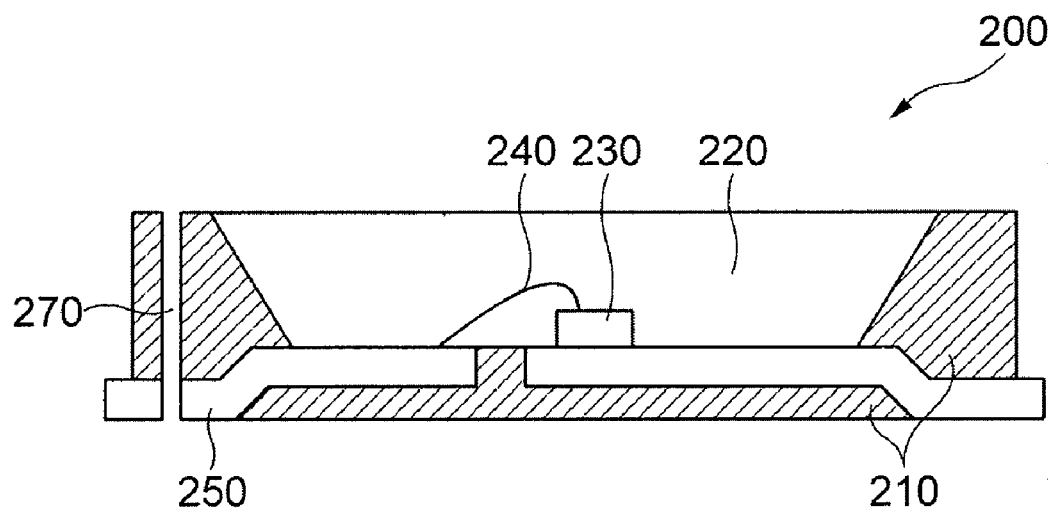

[FIG. 5]
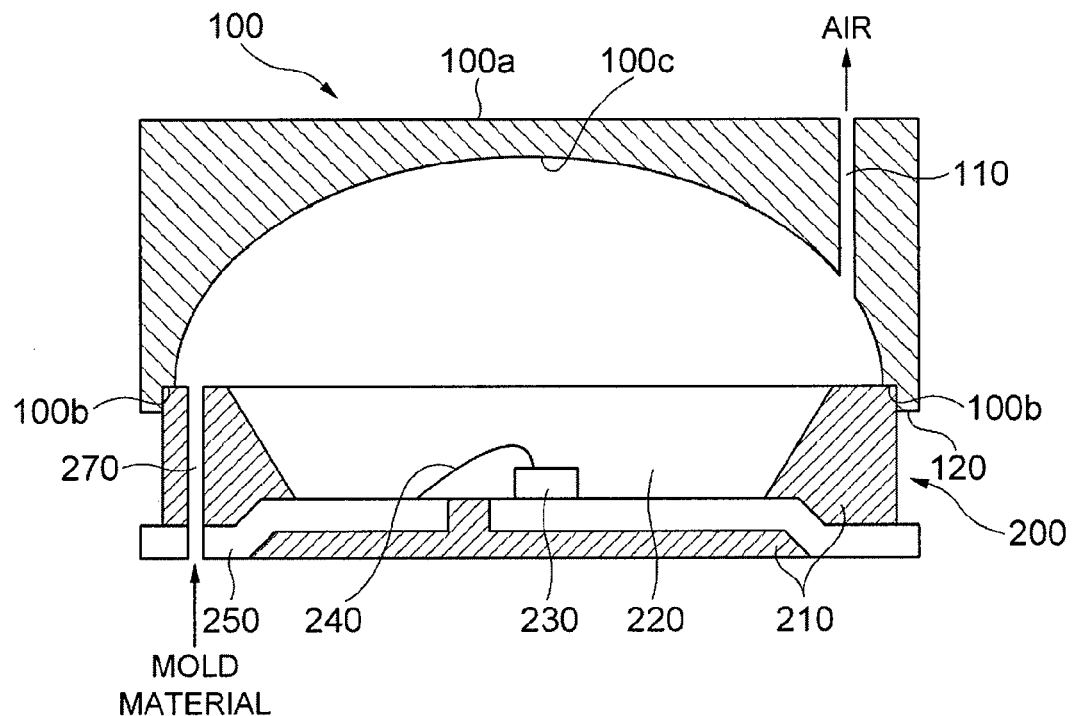
[FIG. 6]
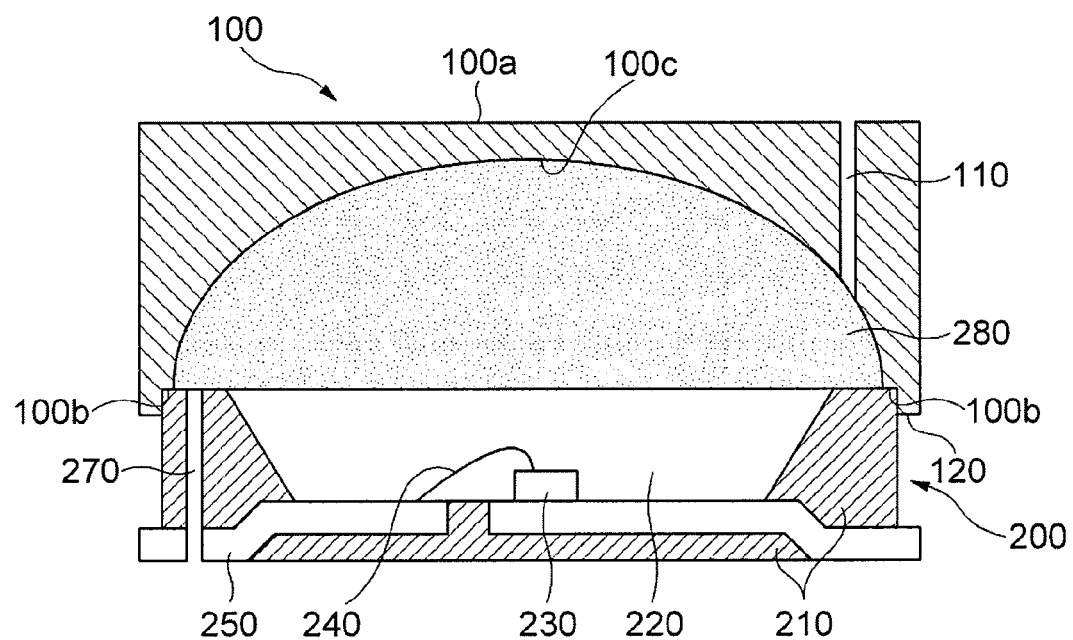

[FIG. 7]
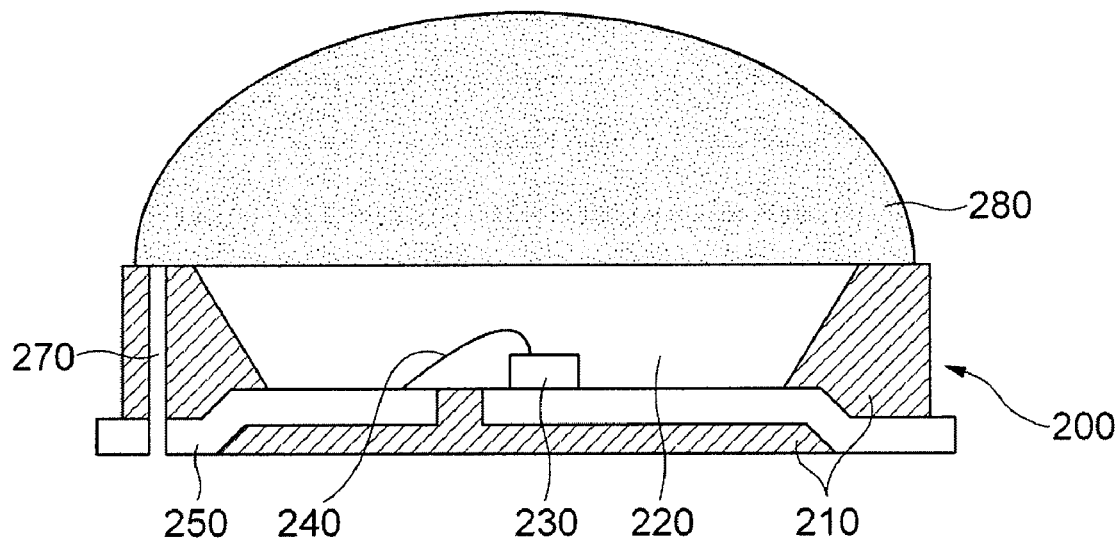

METHOD OF MANUFACTURING LED PACKAGE FOR FORMATION OF MOLDING MEMBER

CROSS-REFERENCE TO RELATED APPLICATIONS

This application claims the benefit of Korean Patent Application No. 10-2007-0097217 filed with the Korea Intellectual Property Office on Sep. 27, 2007, the disclosure of which is incorporated herein by reference.

BACKGROUND OF THE INVENTION

1. Field of the Invention

The present invention relates to a method of manufacturing a light emitting diode (LED) package.

2. Description of the Related Art

In general, a light emitting device includes a package having an LED mounted therein and a lens which covers the LED so as to enhance light emission efficiency within a predetermined orientation angle. Such a lens is previously manufactured by casting or the like, and is then coupled to the package through an adhesive. However, since the coupling force between the lens and the package is weak and the coupling operation is performed in a state where the package is exposed to the air, voids may be formed.

Recently, a transfer molding method is used, in which a lens-shaped molding member is formed on a package by using epoxy or silicon resin.

The transfer molding method which forms a molding member by using resin has been disclosed in US Patent No. 2003-0168720 tilted "Semiconductor device and manufacturing method for the same".

Hereinafter, referring to FIG. 1, a method of forming a molding member disclosed in US Patent No. 2003-0168720 will be described in detail.

FIG. 1 is a process diagram for explaining a conventional method of forming a molding member. First, a metal plate is perforated so as to form a lead frame having a plurality of metal leads (not shown), an air vent frame 303, and an injection frame 305. At this time, the lead frame is formed by a pressing process such that ends of the metal leads are positioned under the frames 303 and 305.

Next, a package support portion (package main body) 304 is formed by injection molding. At this time, the package main body 304 is formed by inserting and molding a heat sink 302 and the lead frame in a die. The package main body 304 has recesses which expose the ends of the metal leads and the heat sink 302. Further, the package main body 304 has gates 306 adjacent to the frames 303 and 305.

Then, an LED 301 is mounted on the heat sink 302, and is electrically connected to the metal leads through wire bonding.

Subsequently, a predetermined surface of an upper die 401 is pressurized so as to be positioned adjacent to the upper surface of the package main body 304. The upper mold 401 is molded so as to have a trench for guiding an injection-molded mold material, a trench for guiding gas, and recesses and protrusions for forming a molding member into a desired shape. The mold material flows to the gate 306 along the upper surface of the injection frame 305, and gas is discharged along the upper surface of the air vent frame 303.

Accordingly, as a space 403 is filled with the mold material, a molding member is formed in a desired shape.

When the space 403 is substituted with the mold material by using the transfer molding method, the gate 306 at the air vent frame 303 may be clogged with the mold material before the space 403 is completely filled with the mold material.

Accordingly, the gas within the space 403 is not perfectly discharged, but may be captured in the mold material, thereby forming voids. The voids may not only cause solidification defects of the mold member, but also reduce uniformity and efficiency of light emitted through the mold member.

SUMMARY OF THE INVENTION

An advantage of the present invention is that it provides a method of manufacturing an LED package, which can suppress the occurrence of voids by preventing gas from being captured in a mold member when the mold member is formed by a transfer molding method.

Additional aspect and advantages of the present general inventive concept will be set forth in part in the description which follows and, in part, will be obvious from the description, or may be learned by practice of the general inventive concept.

According to an aspect of the invention, a method of manufacturing an LED package comprises preparing a mold die which includes an upper surface and a lower surface having an outer circumferential surface and a concave surface surrounded by the outer circumferential surface, the mold die having an outlet extending from the upper surface to the lower surface; preparing a base having a light emitting section formed therein; forming an inlet formed in a predetermined region of the base excluding the region where the light emitting section is formed; positioning the mold die on the light emitting section; forming a mold member by injecting a molding compound into the inlet of the base; and removing the mold die.

According to another aspect of the invention, a method of manufacturing an LED package comprises preparing a mold die which includes an upper surface and a lower surface having an outer circumferential surface and a concave surface surrounded by the outer circumferential surface, the mold die having an inlet extending from the upper surface to the lower surface; preparing a base having a light emitting section formed therein; forming an outlet formed in a predetermined region of the base excluding the region where the light emitting section is formed; positioning the mold die on the light emitting section; forming a mold member by injecting a molding compound into the inlet of the base; and removing the mold die.

The molding compound may be formed of transparent epoxy or silicon resin.

The outlet may be formed so as to face the inlet in the diagonal direction.

The base having the light emitting section formed therein may include a lead frame composed of one or more pairs of lead terminals; a package that houses a portion of the lead frame and has an emission window which is opened in such a manner that light is emitted; an LED chip that is mounted on the lead frame positioned inside the package; an electrode connection portion that electrically connects the LED chip and the lead frame; and a molding compound that is filled into the package so as to protect the LED chip.

The LED chip may include at least one or more LED chips among a red LED, a green LED, a blue LED, a yellow LED, and an orange LED.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a process diagram for explaining a conventional method of forming a molding member; and FIGS. 2 to 7 are process diagrams sequentially showing a method of manufacturing an LED package according to an embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, a method of manufacturing an LED package according to the present invention will be described in detail with reference to the accompanying drawings.

FIGS. 2 to 7 are process diagrams sequentially showing a method of manufacturing an LED package according to an embodiment of the invention.

First, as shown in FIG. 2, a mold die 100 for forming a mold member is formed.

The mold die 100 includes an upper surface 100a and a lower surface having an outer circumferential surface 100b and a concave surface 100c surrounded by the outer circumferential surface 100b. As shown in FIG. 2, the upper surface 100a and the lower surface may be connected through a side surface. Alternatively, the upper surface 100a and the lower surface may be connected without a side surface. That is, the upper surface 100a of the mold die 100 is not limited to a flat surface, but may be formed in various shapes depending on a process condition.

The concave surface 100c of the mold die 100 has a shape corresponding to a molding member which is to be formed in a desired shape. Accordingly, although not shown, the concave surface 100c may have one or more grooves or protrusions formed thereon, the grooves or protrusions enhancing light extraction efficiency.

The outer circumferential surface 100b, which is adjacent to the upper surface of a base which will be described below, may be formed of a plane surface, but is not limited thereto. Alternatively, the outer circumferential surface 100b may be an inclined surface for forming a space between the upper surface of the base and the outer circumferential surface of the mold die 100. Further, the outer circumferential surface 100b has protrusions 120 formed at the edge thereof, the protrusion 120 surrounding the side wall of the base. In this case, the protrusion 120 may be formed continuously or intermittently along the edge of the outer circumferential surface 100b.

The mold die 100 according to the invention has an outlet 110 extending from the upper surface 100a to the lower surface. The outlet 110, which is a through-hole passing through the mold die 100, may extend from the upper surface 100a to the concave surface 100c. Preferably, however, the outlet 100 extends to the outer circumferential surface 110b.

The mold die 100 may be formed by an injection molding technique. Meanwhile, although not shown, a connection frame may be inserted and molded so as to form a plurality of mold dies 100. In this case, the plurality of mold dies 100 are connected to each other through the connection frame so as to be used as one unit.

Preferably, the outlet 100 is formed vertically with respect to the upper surface of the base, or is formed to be tilted toward the outside of the lower surface from the center of the upper surface 100a of the mold die 100. This will be described below.

Next, as shown in FIGS. 3 and 4, the base 200 having a light emitting section 200a formed therein is prepared.

The base 200 includes a package 210 having a cavity formed in the center thereof. The light emitting section 200a is formed in the cavity. The package 210 has an emission window formed on one surface thereof, the window being opened in such a manner that light is easily emitted. Further, the package 210 has a lead frame 250 formed on another surface thereof. The lead frame 250 is composed of one or more pairs of lead terminals so as to be mounted on a printed circuit board (not shown).

The lead frame 250 according to an embodiment of the invention is partially housed in the package 210, and the lower surface of the lead frame 250, which is housed in the package 210 and is positioned at the end of the package 210, is bent in the package 210 so as to be exposed to the outside through the bottom surface of the package 210. In other words, a portion of the lead frame 250 housed in the package 210 is exposed to the outside through the bottom surface of the package 210, and a printed circuit board (not shown) is mounted on the lower surface of the exposed lead frame 250.

Inside the package 210 constructed in such a manner, an LED chip 230 is disposed in such a manner that the light emitting surface thereof is directed to the emission window of the package 210. The lead frame 250 and the LED chip 230 are electrically connected to each other through an electrode connection portion 240.

The electrode connection portion 240, which serves to electrically connect the LED chip 230 and the lead frame 250, may be formed of a wire or conductive adhesive depending on an element characteristic and a process condition.

Inside the package 210 having the LED chip 230 mounted therein, a molding compound 220 for protecting the LED chip 230 and the electrode connection portion 240 is filled. The molding compound 220 is formed of any one selected from transparent epoxy, silicon, and phosphor mixture so as to transmit light emitted from LED chip 230 to the outside. The molding compound 220 also serves to radiate heat generated from the LED chip 230 excluding heat radiated through the lead frame 250.

The LED chips 230 are composed of red, green, blue, yellow, and orange LEDs.

In particular, the base 200 according to the invention has an inlet 270 formed in a predetermined region thereof excluding the region where the light emitting section 200a is formed.

The inlet 270, which is a through-hole passing through the base 200, is formed so as to pass through the lead frame 250 and the package 210.

Like the outlet 110, the inlet 270 may be formed vertically with respect to the upper surface of the base 200, or may be formed so as to be inclined. Preferably, the inlet 270 is formed so as to be separated from the outlet 110. More preferably, the inlet 270 may be formed so as to face the outlet 110 in the diagonal direction.

Subsequently, as shown in FIG. 5, the mold die 100 is positioned on the light emitting portion 200a of the base 200.

More specifically, the concave surface 100c of the mold die 100 covers the light emitting section 200a, and the base 200 and the mold die 100 are coupled to each other such that the outer circumferential surface 100b abuts on the upper surface of the base 200. At this time, the protrusions 120 of the mold die 100 surrounds the end of the base 100. The protrusions 120 reduce the leakage of a molding compound between the mold die 100 and the base 200, and serve as an alignment key which aligns the mold die 100 and the base 200.

Then, a molding compound such as transparent epoxy or silicon resin is injected through the inlet 270 of the base 200. The molding compound may contain phosphor and/or diffuser. The molding compound fills the space surrounded by the mold die 100 and the base 200 from the lower side. Gas within the space is discharged to the outside through the outlet 110 formed in the mold die 100. Since the outlet 110 is positioned above the space, the internal gas can be continuously discharged through the outlet 110 until the molding compound fills up the space.

Accordingly, the internal gas is prevented from being captured into the molding compound, which makes it possible to prevent voids from occurring.

Next, as shown in FIG. 6, after the space is filled with the molding compound, the molding compound is solidified so as to form a mold member 280.

The shape of the mold member 280 is determined by the shape of the concave surface 100c of the mold die 100. Therefore, the mold member 280 may be formed in various shapes by changing the shape of the concave surface 100c of the mold die 100.

Then, after the solidification process is completed, the mold die 100 is removed. Then, as shown in FIG. 7, a package having the mold member 280 with a desired shape is completely manufactured.

In this embodiment, the outlet 110 is formed in the mold die 100, and the inlet 270 is formed in the base 200. Without being limited thereto, however, the outlet may be formed in the base, and the inlet may be formed in the mold die.

According to the present invention, when a lens-shaped mold member is formed on the package by a transfer molding method, gas within the space is completely discharged through the outlet formed in the mold die or the base such that voids are prevented from occurring in the mold material. Therefore, it is possible to stabilize the process of forming the mold member and to enhance the uniformity and efficiency of light emitted through the mold member.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a light emitting diode (LED) package, comprising:

preparing a mold die which includes an upper surface and a lower surface having an outer circumferential surface and a concave surface surrounded by the outer circumferential surface, the mold die having an outlet extending from the upper surface to the lower surface;

preparing a base having a light emitting section formed therein;

forming an inlet in a predetermined region of the base adjacent the outer side surface of the base, excluding the region under or over which the light emitting section is formed;

positioning the mold die on the light emitting section;

forming a mold member by injecting a molding compound into the inlet of the base; and removing the mold die, wherein the outlet is formed in a region of the mold die adjacent the outer circumferential surface of the mold die so as to face the inlet, wherein the inlet is diagonally offset from the outlet with respect to an inside space defined by the molding die and the base, and wherein the base having the light emitting section formed therein includes:

a lead frame composed of one or more pairs of lead terminals;

a package that houses a portion of the lead frame and has an emission window which is opened in such a manner that light is emitted;

an LED chip that is mounted on the lead frame positioned inside the package;

an electrode connection portion that electrically connects the LED chip and the lead frame; and the molding compound that is filled into the package so as to protect the LED chip, and wherein the portion of the lead frame housed in the package is exposed to the outside through the bottom surface of the package, and a printed circuit board is mounted on the lower surface of the exposed lead frame.

2. The method according to claim 1, wherein the molding compound is formed of transparent epoxy or silicon resin.

3. The method according to claim 1, wherein the LED chip includes at least one or more LED chips among a red LED, a green LED, a blue LED, a yellow LED, and an orange LED.

4. The method of claim 1, wherein the inlet and outlet are formed in a vertical direction with respect to the upper surface of the base.

5. The method of claim 1, wherein gas in the inside space defined by the molding die and the base is discharged to the outside via the outlet.

* * * * *